(12) United States Patent
Hu et al.

(10) Patent No.: US 9,549,474 B2
(45) Date of Patent: Jan. 17, 2017

(54) COVER REMOVAL FIXTURE

(71) Applicant: THOMSON LICENSING, Issy de Moulineaux (FR)

(72) Inventors: Ying Jie Hu, Beijing (CN); Kian Choy Kiew, Beijing (CN); Wen Xin Huang, Beijing (CN)

(73) Assignee: THOMSON LICENSING, Issy les Moulineaux (FR)

( * ) Notice: Subject to any disclaimer, the term of this patent is extended or adjusted under 35 U.S.C. 154(b) by 0 days.

(21) Appl. No.: 14/415,508

(22) PCT Filed: May 21, 2013

(86) PCT No.: PCT/CN2013/076003
§ 371 (c)(1),
(2) Date: Jan. 16, 2015

(87) PCT Pub. No.: WO2014/012396
PCT Pub. Date: Jan. 23, 2014

(65) Prior Publication Data
US 2015/0201505 A1      Jul. 16, 2015

(30) Foreign Application Priority Data

Jul. 16, 2012  (WO) ................ PCT/CN2012/078718

(51) Int. Cl.
*G06F 1/16*       (2006.01)
*H05K 5/00*      (2006.01)
(Continued)

(52) U.S. Cl.
CPC .......... *H05K 5/0013* (2013.01); *H05K 5/0217* (2013.01); *H05K 5/03* (2013.01); *Y10T 29/49822* (2015.01)

(58) Field of Classification Search
CPC .............. A24F 15/12; H02J 7/00; G01S 7/032
(Continued)

(56) References Cited

U.S. PATENT DOCUMENTS 4,585,122 A    4/1986  Stegenga
4,653,783 A    3/1987  Steup
(Continued)

FOREIGN PATENT DOCUMENTS

CN      101351094 A    1/2009
EP      0090921         10/1983
(Continued)

OTHER PUBLICATIONS

Search Report PA120031 Dated : Aug. 5, 2013.
Search Report PU110073 Dated : Feb. 4, 2013.

*Primary Examiner* — Hung Duong
(74) *Attorney, Agent, or Firm* — Brian J. Dorini; Jerome G. Schaefer

(57) ABSTRACT

A method and apparatus for disassembling a set top box is disclosed. The method includes providing the set top box including: a top cover, a base, and cover retention clips, wherein the cover retention clips are V or U shaped for securing the top cover to the base, providing a release fixture including a retention clip release finger, inserting the release fixture into the set top box, disengaging the cover retention clips using the retention clip release finger, and removing the top cover from the base.

15 Claims, 12 Drawing Sheets

(51) Int. Cl.
*H05K 5/02* (2006.01)
*H05K 5/03* (2006.01)

(58) Field of Classification Search
USPC ............... 439/587, 595, 271, 352, 676, 578, 660,439/493; 312/223.1, 125, 135, 236, 326, 117, 312/258; 16/42 R; 174/655, 660, 169, 158 R, 51, 174/254, 350, 262, 117 F; 248/551, 514, 316.1, 248/176.3, 422, 211.1; 361/679.27, 679.08, 361/679.47, 679.54, 679.02, 679.44, 679.41, 361/679.55, 679.3, 679.26, 679.48, 679.49
See application file for complete search history.

(56) References Cited

U.S. PATENT DOCUMENTS

| | | | |
|---|---|---|---|
| 4,673,100 | A | 6/1987 | Reis et al. |
| 5,551,585 | A | 9/1996 | Huang et al. |
| 5,636,535 | A | 6/1997 | Shimada |
| 5,823,341 | A | 10/1998 | Nakasuji |
| 5,835,799 | A * | 11/1998 | Washisu ............... G02B 27/646 359/554 |
| 6,296,334 | B1 | 10/2001 | Liao |
| 6,545,216 | B1 | 4/2003 | Bell et al. |
| 6,659,797 | B2 * | 12/2003 | Ichio ............... H01R 13/4361 439/595 |
| 7,944,690 | B2 | 5/2011 | Yamagiwa |
| 8,740,650 | B2 * | 6/2014 | Huang ............... G06K 7/0021 439/620.15 |
| 8,752,911 | B2 | 6/2014 | Dernier et al. |
| 9,261,588 | B2 * | 2/2016 | Kim ............... G01S 13/02 |
| 2009/0190291 | A1 | 7/2009 | Yamagiwa |
| 2011/0115349 | A1 | 5/2011 | Dernier |

FOREIGN PATENT DOCUMENTS

| | | | |
|---|---|---|---|
| EP | 0653534 | | 5/1995 |
| EP | 2086301 A2 | | 8/2009 |
| FR | 2810018 | * | 6/2000 ............ G07F 19/00 |
| FR | 2810018 A1 | | 12/2001 |
| GB | 2282845 A | | 4/1995 |
| JP | 01156586 | | 10/1989 |
| JP | 07027236 | | 5/1995 |
| JP | 09261819 | | 10/1997 |
| JP | 2007005701 | | 1/2007 |
| WO | WO2010008360 A1 | | 1/2010 |

* cited by examiner

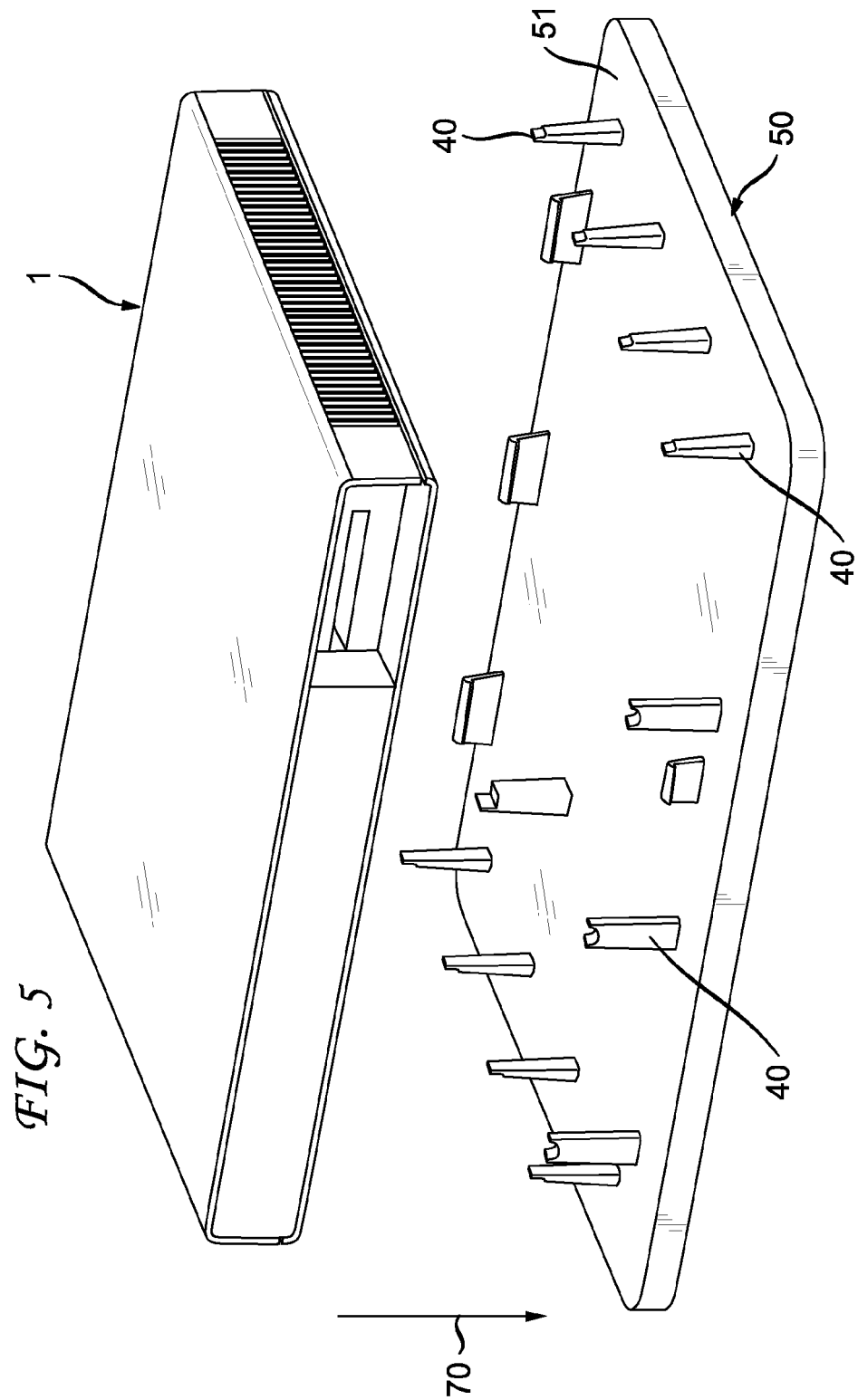

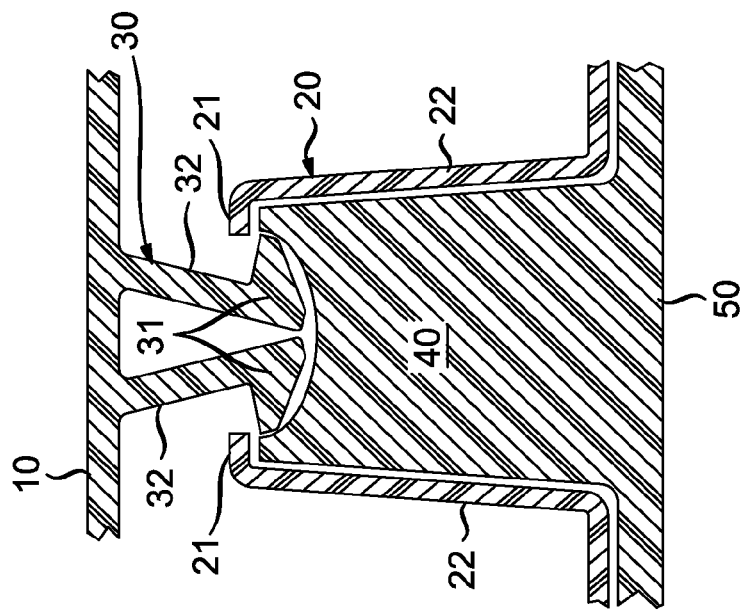
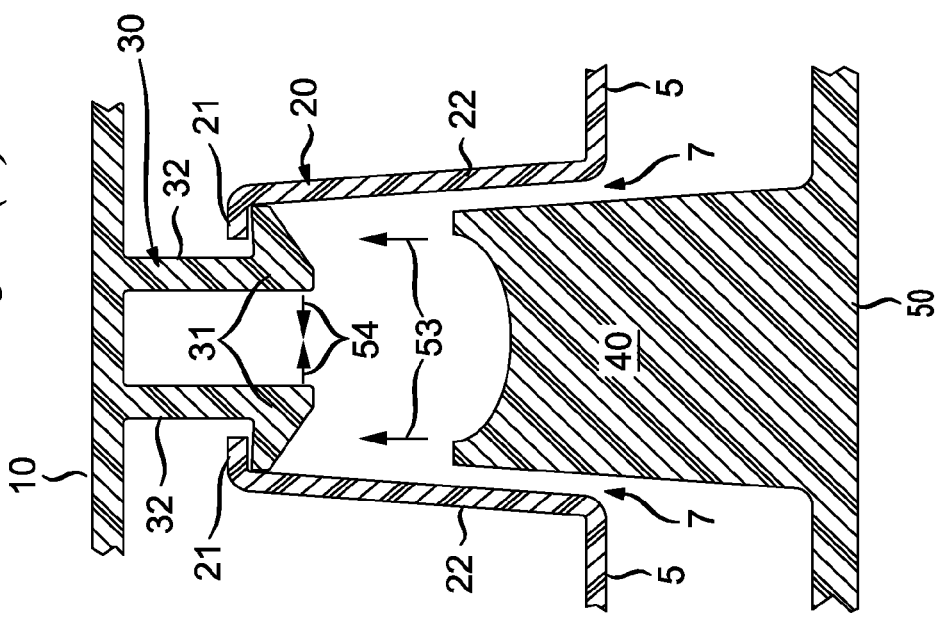

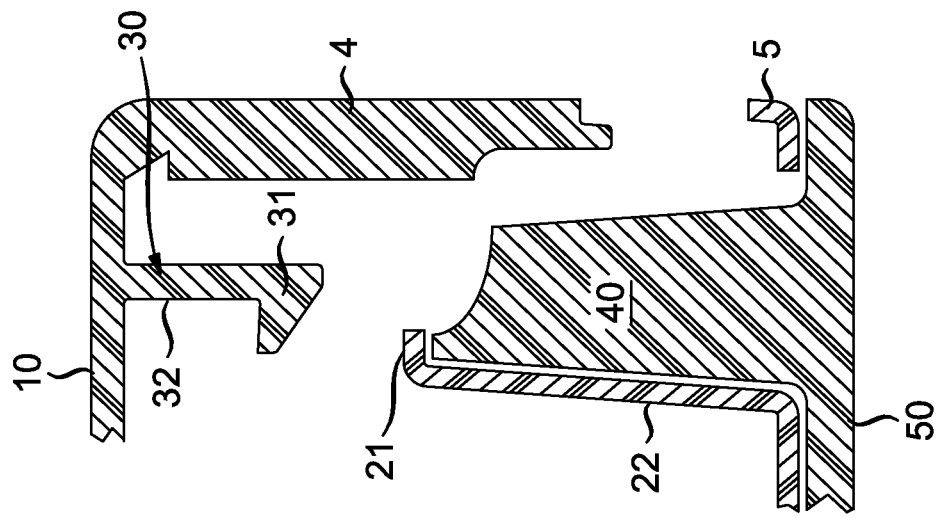
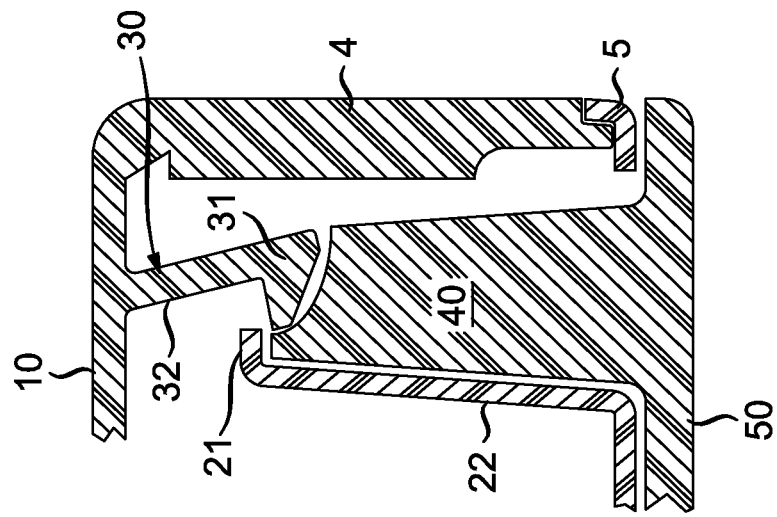

COVER REMOVAL FIXTURE

This application claims the benefit, under 35 U.S.C. §365 of International Application PCT/CN2013/076003, filed May 21, 2013, which was published in accordance with PCT Article 21(2) on Jan. 23, 2014, in English and which claims the benefit of International Application PCT/CN2012/078718, filed Jul. 16, 2012, in English, which are incorporated by reference in their respective entireties.

BACKGROUND

Electronic apparatuses or devices such as set-top boxes can be assembled apparatuses having a plurality of walls wherein at least one of the walls can be secured with a plurality of screws. Unfortunately, gaining access to the interior components of these devices can require removing the plurality of screws which can often require excessive handling of the device. The excessive handling often can involve changing the orientation of the device, such as by turning the device upside down or placing it on its sides, to find each of the screws. This can then be followed by disassembling the device by removal of one screw at a time with the device being upside down or on its side. This excessive handling of the device can increase the chances of damaging the interior components because each motion of the device can jar the components. Additionally, the removal and reengaging of the screws can present an opportunity for scratching the device or stripping threads of the screws.

In light of the fact that interior components of electronic devices can often need to be accessed and that accessing the interior components can place the interior components at risk of damage or can place the electronic device at risk for scratches, a need can exist for an improved electronic device structure and method for opening the electronic device which is fast, simple, and safe.

To meet this need one known system is disclosed in WO2010008360A1. FIG. 1 is a perspective view of the apparatus according to WO2010008360A1 in a disassembled condition. An apparatus 1, such as a set top box, can comprise an enclosure having exterior walls defining an interior space, a top 10 having an interior surface 112 and a plurality of coupling clips 30 extending from the interior surface, and a base 5. The base 5 has an inner surface, a plurality of clip receiving members 20 extending from the inner surface which engage the coupling clips 30 to secure the top 10 to the base 5. The base 5 further includes at least one aperture 7 adapted to permit a release fixture 50 having a plurality of decoupling members 40 extending from a plate 51 to simultaneously disengage the clip receiving members 20.

The method of assembling the apparatus 1 according to WO2010008360A1 includes: pushing a base 5 and top 10 together by applying a vertical force; simultaneously contacting coupling clips 30 of the top 10 with clip receiving members 20 of the base 5; laterally repositioning grasping portions 31 of the coupling clips 30; and snapping the grasping portions 31 into their initial lateral positions or some intermediate positions. There can be a lateral and vertical overlap of portions of the coupling clips 30 and part of the clip receiving members 20 which can cause the top 10 and base 5 to be disassembled. The clips and clip receiving members can be referred to as locks which can be unlocked by decoupling members. The method can further include steps for dissembling the apparatus, including: aligning a release fixture to the base 5; applying a linear force to the release fixture 50 to cause a plurality of decoupling members 40 extending from a plate 51 of the release fixture 50 to enter apertures of the base 5; substantially contacting the decoupling members 40 to the grasping portions 31 simultaneously; laterally repositioning grasping portions 31 of the coupling clips 30 to disengage the grasping portions 31; and lifting off the top 10.

FIG. 1 shows the apparatus 1 according to WO2010008360A1 in a disassembled condition. The apparatus 1 can be an electronic apparatus such as a set-top box. The apparatus 1 can includes an enclosure having exterior walls defining an interior space. The enclosure can house various electronic components such as processors, smart card assemblies, tuners, fans, storage devices, etc. These components can be supported in an interior support structure 60 which itself can have side walls and a base. The exterior walls can be a front wall 8, rear wall 6, side walls 4, a top 10 and a base 5.

The base 5 has an inner surface 13 opposite the outer surface and facing the top 10. The base 5 further includes a plurality of clip receiving members 20 extending from the inner surface 13, which are designed to secure the base 5 to the top 10. The base 5 further includes a series of apertures 7 which are associated with the clip receiving members 20 and are adjacent or near the clip receiving members 20.

In one example, there is one aperture 7 for each clip receiving member 20. However, in other examples of WO2010008360A1, single apertures 7 can be associated with and used for multiple clip receiving members 20.

The top 10 of the apparatus 1 includes an exterior surface 11 and interior surface 112. The top 10 further includes a plurality of coupling clips 30 designed to engage or snap into the clip receiving members 20 of the base 5. The plurality of coupling clips 30 effectively secures the top 10 to the base 5.

The expression "snap" can imply either that some part of the coupling clips 30 and/or some part of the clip receiving members 20 are flexible or resilient to permit some lateral repositioning or motion of either part when a vertical force is applied pushing the base 5 and top 10 together to cause the coupling clips 30 and/or some portion of the clip receiving members 20 to contact. Further, lateral repositioning or motion can occur upon the contact and can increase as the coupling clips 30 and/or some portion of the clip receiving members 20 move further in opposite vertical directions with the force. The force finally causes the top 10 and base 5 to be in a predetermined assembled state. In terms of the separation dimension, the part of the coupling clip 30 or clip receiving members 20 which had been repositioned or moved can return to its initial lateral position or some intermediate position such that there is a lateral and vertical overlap of portions of the coupling clips 30 and/or part of the clip receiving members 20, for example, a shoulder. The lateral and vertical overlap of portion of the coupling clips and/or part of the clip receiving member can cause the top 10 and base 5 to be assembled or fixed together. The top 10 and base 5 cannot be separated in a nondestructive manner by opposite vertical forces that attempt to separate the top 10 and base 5. "Snapping" can often be assumed to imply rapid or immediate movement toward the initial state, however, the movement can be slow.

The interior support structure 60 can have holes or slots 9 which can be also associated with the apertures 7 to allow clearance for the clip receiving members 20.

FIGS. 2A and 2B are an exploded view of the coupling clips of the apparatus of FIG. 1. FIG. 2A shows a two-prong coupling clip 30 extending from the inner surface 12 of the top 10. Each prong has a grasping portion 31 at a distal end of a downwardly or inwardly extending portion 32. The grasping portion 31 can have a shoulder and a sloped side extending down or away from the end of the shoulder and forming an acute angle with the shoulder. The slope side can be curved with at least part of the surface forming an acute angle with the shoulder. In FIG. 2A, the shoulders of the grasping portions 31 extend away from one another.

FIG. 2B shows an example of a one-prong coupling clip 30. The one prong has a grasping portion 31 at a distal end of a downwardly or inwardly extending portion 32. The grasping portion 31 can also have a shoulder and a sloped side extending from the end of the shoulder downwardly or away from the inner surface 12. A portion of the sloped side can form an acute angle with the shoulder. The distal end can extend at least two different lengths from the top. Grasping portion 31 can extend in at least two different dimensions from the top, which can make it more difficult for unauthorized disassembly of the apparatus.

FIG. 3 is a perspective view of a coupling clip engaged in a clip receiving member of the assembled apparatus according to WO2010008360A1. FIG. 3 illustrates how the two-prong coupling clip 30 of FIG. 2A can engage the clip receiving member 20 of the base 5. Clip receiving member 20 extends from the base 5 and has a shoulder 21 at a distal end of an upwardly or inwardly extending part 22. FIG. 3 shows an example of an aperture 7 which can be formed in the base 5. Each aperture 7 can correspond to an engagement for coupling clip 30 with clip receiving member 20. The distal end of the upwardly or inwardly extending part 22 can refer to the location remote from the base 5 where the shoulders 21 of the clip receiving member 20 extends. The structure of the clip receiving member 20 can have additional parts or an extension that extends passed the shoulder. The distal end of the clip receiving member 20 can refer to a location remote from the base 5 where the shoulder 21 of the clip receiving member 20 extends.

FIG. 3 shows the grasping portions 31 snapped into the clip receiving member 20 by having the respective shoulders of the grasping portions 31 extending passed the shoulders 21 of the clip receiving members 20. The respective shoulders can overlap and be in contact with each other or in proximity to each other, thereby securing the top 10 to the base 5.

FIG. 3 also shows the front wall 8 being held into an assembled state by being positioned in slots 3 in the top 10 and base 5. This illustrates another feature of WO2010008360A1 which is that examples can include some or all of the walls being held into place by slots 3 in the top 10 and/or base 5. This feature can be advantageous because it can use fewer screws or no screws at all, which is an object of WO2010008360A1.

FIG. 4 is a perspective view of another coupling clip engaged in a clip receiving member of the assembled apparatus according to WO2010008360A1. FIG. 4 illustrates how the one-prong coupling clip 30 of FIG. 2B can engage the clip receiving member 20 of the base 5. FIG. 4 also shows an aperture 7 which can be formed in the base 5 and associated with the engagement of the illustrated coupling clip 30 and clip receiving member 20. An aperture 7 can also be slot cut or formed into the base 5. The clip receiving member 20 engages the coupling clip 30 the same way as that in FIG. 3.

A key feature of WO2010008360A1 can be that there is a plurality of coupling clip 30 and clip receiving member 20 engagements and that in a preferred example, the engagements during assembly can be performed substantially simultaneously. The expression simultaneously can be used to include situations where there can be some slack from one engagement to another. For example, the length of travel for one engagement can be 5% greater than the length on another engagement. The engagements being simultaneous can be advantageous because it can prevent twisting or tilting of the top 10 with respect to the base 5. Further elements of WO2010008360A1 can include only one-prong coupling clips 30 in the apparatus 1, only two-prong coupling clips 30, or a combination of both.

FIG. 5 is a perspective view of the assembled apparatus and a release fixture according to WO2010008360A1. FIG. 5 introduces another element of WO2010008360A1, where the apparatus can be designed to be easily disassembled by using a single tool in one simple and single linear motion 70 while the apparatus 1 is maintained in its normal operating orientation. The tool can be a release fixture 50 that has a plurality of decoupling members 40 extending from a plate 51 to simultaneously disengage the coupling clips 30 from the clip receiving members 20. The feature of having the disengagements being simultaneous can be advantageous because it can prevent twisting or tilting of the top with respect to the base 5. The decoupling members 40 are each designed to align with apertures 7 and contact the coupling clips 30. To disassemble the apparatus 1, the release fixture 50 is placed on a flat surface. The apparatus 1 is aligned with the release fixture 50, and then in one motion the apparatus 1 is placed and pushed toward the release fixture 50. The motion causes the decoupling members 40 to disengage the coupling clips 30 from the clip receiving members 20 as shown in FIGS. 6 and 7.

FIG. 6 is a cross-section of the apparatus and release fixture according to WO2010008360A1 during various steps of disassembly of the apparatus. FIG. 6 illustrates how the two-prong coupling clip 30 is disengaged during the single linear motion 70 in FIG. 5. FIG. 6A shows the decoupling member 40 as having a U-shape design with flat upper edges that contact the grasping portions 31 when the decoupling member 40 enters the aperture 7 and applies an upward or inward force 53. The upward or inward force 53 can cause the grasping portion 31 to shift in a direction 54 away from the upwardly extending part 22 such that the downwardly extending portion 32 bends and/or angles to a position where the shoulder of the grasping portion 31 clears or moves passed the shoulder 21 of the clip receiving member 20.

FIG. 6B shows the positioning of the grasping portion 31 when its shoulder clears or moves passed the shoulder 21 of the clip receiving member 20 and the decoupling member 40 is fully inserted. At this point, the top 10 can be removed by simply lifting it as shown in FIG. 6C. FIG. 6C shows the positioning of the grasping portion 31 of the coupling clips 30 when top 10 is lifted, allowing the components within the apparatus 1 to be accessed.

The assembly can be easily reassembled by simply placing the top 10 over the base 5 with the release fixture 50 removed and pressing the top 10 down or toward the base 5. Each of the coupling clips 30 can then be reengaged into the clip receiving members 20.

FIG. 7 is another cross-section of the apparatus and release fixture according to WO2010008360A1 during various steps of disassembly of the apparatus. FIG. 7 illustrates how the one-prong coupling clip 30 is disengaged during the single linear motion 70 in FIG. 5. FIG. 7A shows the decoupling member 40 as having a narrow edge which has a width the same dimension as the shoulder 21. The dimension is such that the narrow edge contacts the grasping portion 31 when the decoupling member 40 enters the aperture 7. The decoupling member can apply an upward or inward force 53 causing the grasping portion 31 to shift in a direction 54 away from the upwardly extending part 22 causing the downwardly extending portion 32 to bend and/or angle to a position where the shoulder of the grasping portion 31 clears or moves passed the shoulder 21 of the clip receiving member 20.

FIG. 7B shows the positioning of the grasping portion 31 of the one-prong coupling clip 30 when its shoulder clears or moves passed the shoulder 21 of the clip receiving member 20 and the decoupling member 40 is fully inserted. At this point, the top 10 can be removed by simply lifting it as shown in FIG. 7C. FIG. 7C shows the positioning of the grasping portion 31 of the coupling clips 30 when top 10 is lifted, thereby allowing the components within the apparatus 1 to be accessed.

Although WO2010008360A1 has its advantages over the prior art, WO2010008360A1 can be somewhat complicated and require coupling clips 30 to extend down from a horizontal interior portion of the top or outer cover 10. This in turn can imply that the interior circuit board and any other interior components can be designed to accommodate the coupling clips 30 and clip receiving members 20.

A need for a simpler design which provides many of the advantages of WO2010008360A1, but is more universal and does not require interior components (such as top broad heatsinks and circuit boards) to be specially designed to accommodate and fit around coupling clips and clip receiving members, exists. Additionally, a need for a design which permits the top of the set top box to remain in a lateral position with respect to the frame and base of the set top box when it is unlatched and a means to secure or hold the set top box as the top is removed exists.

Other known methods can include: strong magnets that can require hands on both the base and the fixture to remove the base; latching devices that can require a second motion by the user to attach and detach the base from the fixture; and complex springs that push the cover from the base.

SUMMARY

A method and apparatus for disassembling a set top box is disclosed. In one embodiment an apparatus (801) comprises: a first wall (1010) having clips (1030) on an interior surface of the first wall; a second wall (1005) having retainers (1020) on an inner surface of the second wall, the inner surface of the second wall facing the interior surface of the first wall, the interior and inner surfaces defining an interior space; wherein the respective clips and retainers are engaged, aligned and oriented relative to one another such that all of the respective clips and retainers can be substantially simultaneously disengaged by a plurality of decoupling members (803) having lock rubbers (804) thereon and having an alignment and orientation corresponding to the respective clips and retainers and adapted to be moved in unison; wherein the lock rubbers are adapted to grasp and hold the second wall down as the first wall is lifted. The apparatus can have the plurality of clips and retainers define a series of locks between the first wall and second wall. The apparatus can be an electronic apparatus such as a set top box and can have at least one electronic component contained therein. The apparatus can also be configured such that the first wall or second wall have apertures distributed therein to permit decoupling members to enter therethrough for disengagement plurality of clips and retainers lock the first wall and second wall together, wherein the apertures are adapted to permit a release fixture having a plurality of decoupling members extending from a plate (802) to substantially simultaneously disengage the clip receiving members.

Other embodiment can include an apparatus (801) comprising: a top (1010) having an interior surface and a plurality of coupling clips (1030) extending from the interior surface; and a base (1005) having an inner surface and a plurality of clip receiving members (1020) extending from the inner surface, the clip receiving members reversibly engaging the coupling clips (1030) to secure the top to the base, the base further including at least one aperture adapted to permit a release fixture (802) having a plurality of decoupling members (803) extending from a plate to simultaneously disengage the clip receiving members; wherein the decoupling members (803) have lock rubbers (804) which align with the respective receiving members and coupling clips; wherein the lock rubbers are adapted to grasp and hold the base as the top is lifted when the decoupling members are inserted in the at least one aperture. The coupling clips can have grasping portions (1031) engaging receiving members. The grasping portions can be at distal ends of inwardly extending portions (1032) that extend from the top. The apparatus can further comprise the clip receiving members including inwardly extending parts (1022) extending from the inner surface with shoulders (1021) at distal ends of inwardly extending parts, and portions of the coupling clips can laterally and vertically overlap the shoulders. The grasping portions can be snapped into the clip receiving members by having the respective shoulders of the grasping portions extending passed the shoulders of the clip receiving members and having the respective shoulders overlap and being contact with each other or in proximately to each other, thereby securing the top to the base. Additionally, at least one grasping portion can have a sloped side that extends from an end of the shoulder and at least part of the sloped side forms an acute angle with the shoulder.

An additional embodiment can be a method that comprises the steps of: providing (1200) a set top box (801); providing (1205) a release fixture (802) having decoupling members (803); aligning and inserting (1210) the decoupling members (803) to a base (1005) of the set top box (801) having a top (1010) connected to the base, wherein grasping portions (1031) of coupling clips (1030) of the top are engaged with clip receiving members (1020) of the base to lock the top to the base; applying (1215) a linear force (1070) to the release fixture to cause the decoupling members in apertures of the base, wherein lock rubbers (804) on each decoupling members wedge against the apertures of the base, thereby coupling the base to the release fixture, and wherein the decoupling members simultaneously contact grasping portions (1031) and laterally reposition the grasping portions of the coupling clips to disengage the grasping portions from the clip receiving members; and lifting (1220) off the top, whereby the base remains on the fixture.

BRIEF DESCRIPTION OF THE DRAWINGS

A more detailed understanding can be had from the following description, given by way of example in conjunction with the accompanying drawings wherein:

FIG. 5 is a perspective view of the assembled apparatus and a release fixture according to WO2010008360A1;

DETAILED DESCRIPTION

Figure 1:
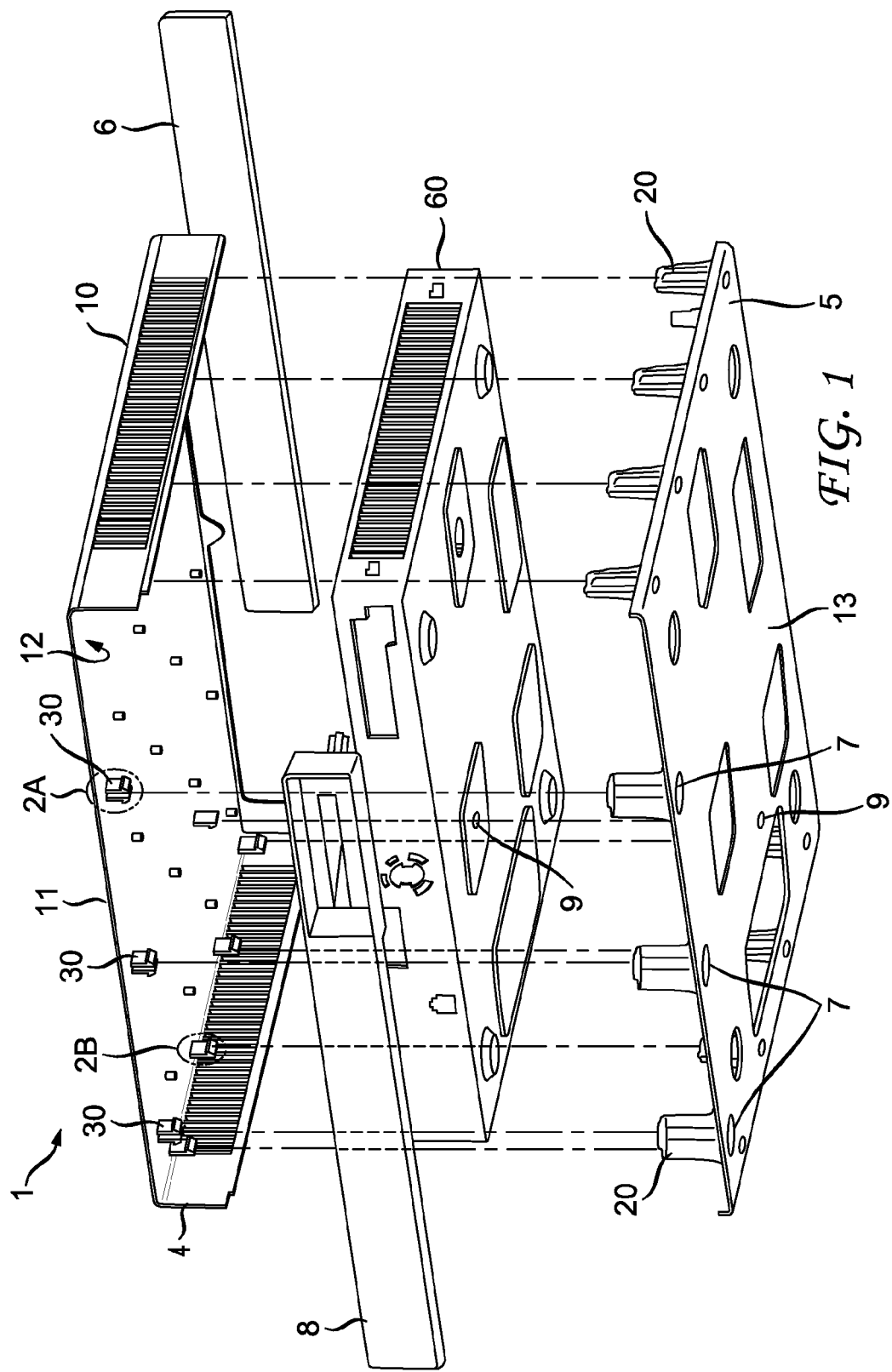
FIG. 1 is a perspective view of the apparatus according to WO2010008360A1 in a disassembled condition.
Figure 2A:
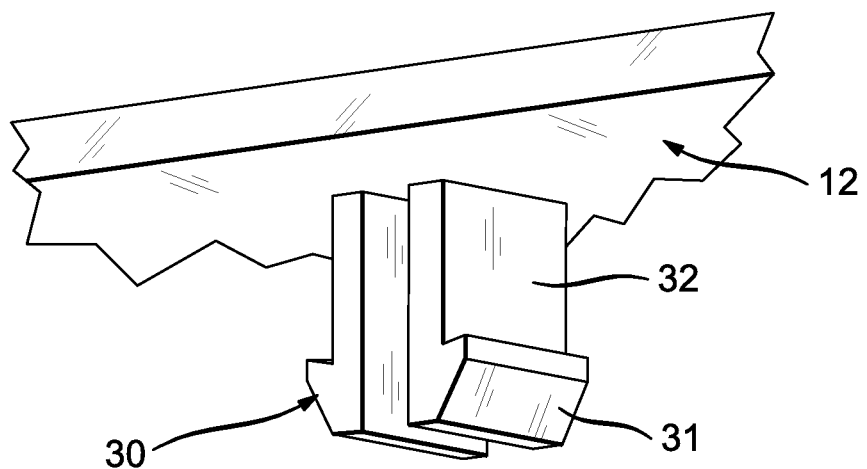
FIGS. 2A and 2B are views of the coupling clips of the apparatus of FIG. 1.
Figure 2B:
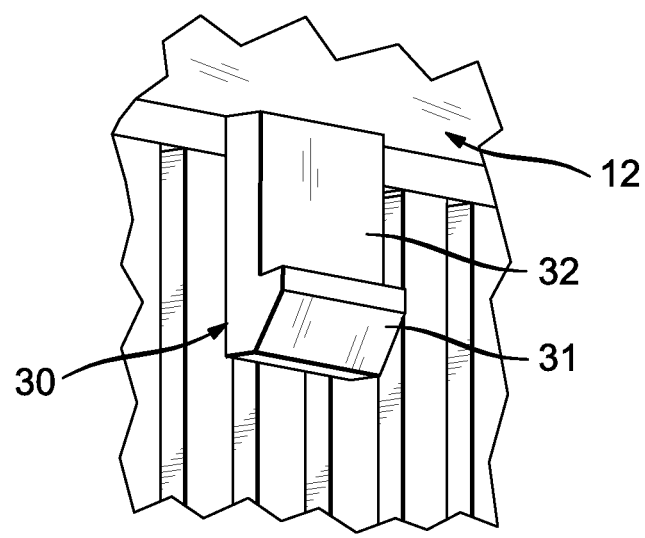
Figure 3:
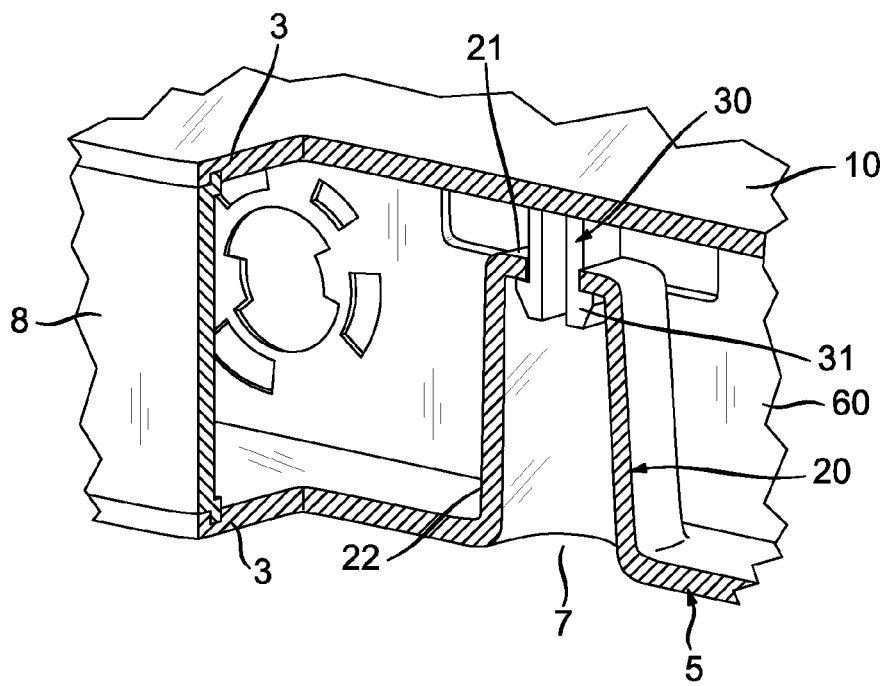
FIG. 3 is a perspective view of a coupling clip engaged in a clip receiving member of the assembled apparatus according to WO2010008360A1.
Figure 4:
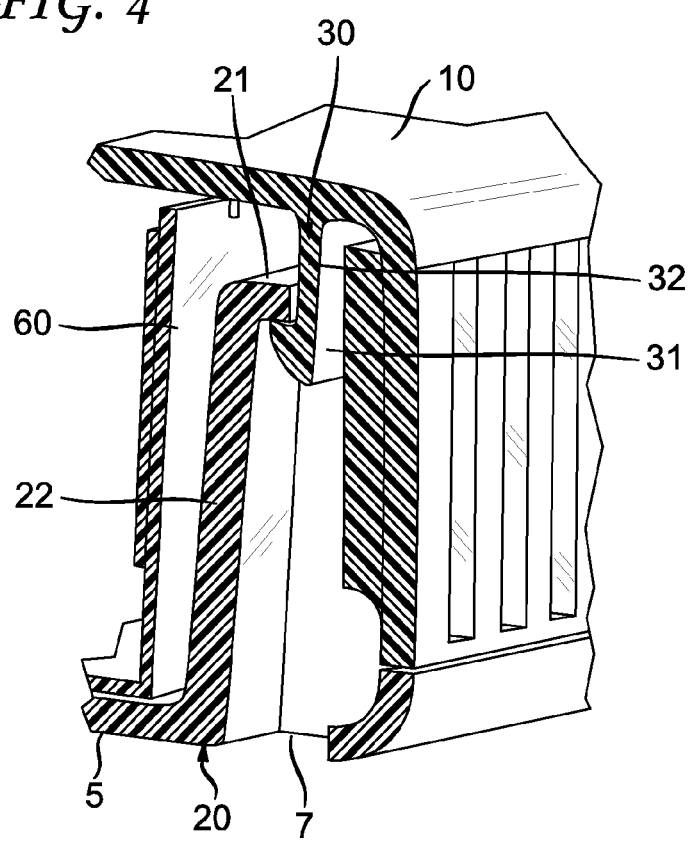
FIG. 4 is a perspective view of another coupling clip engaged in a clip receiving member of the assembled apparatus according to WO2010008360A1.
Figure 7A:
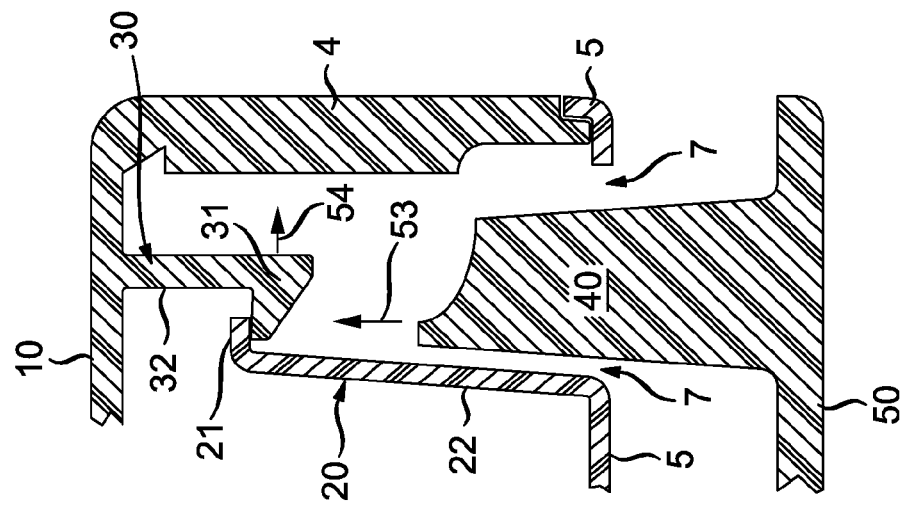
FIG. 7 is another cross-section of the apparatus and release fixture according to WO2010008360A1 during various steps of disassembly of the apparatus.
Figure 6C:
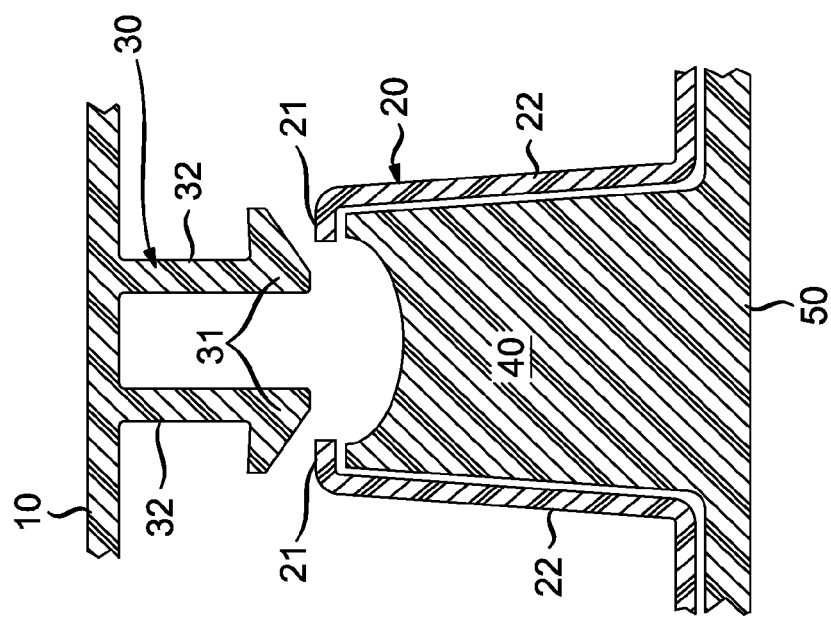
FIG. 6 is a cross-section of the apparatus and release fixture according to WO2010008360A1 during various steps of disassembly of the apparatus.
Figure 8:
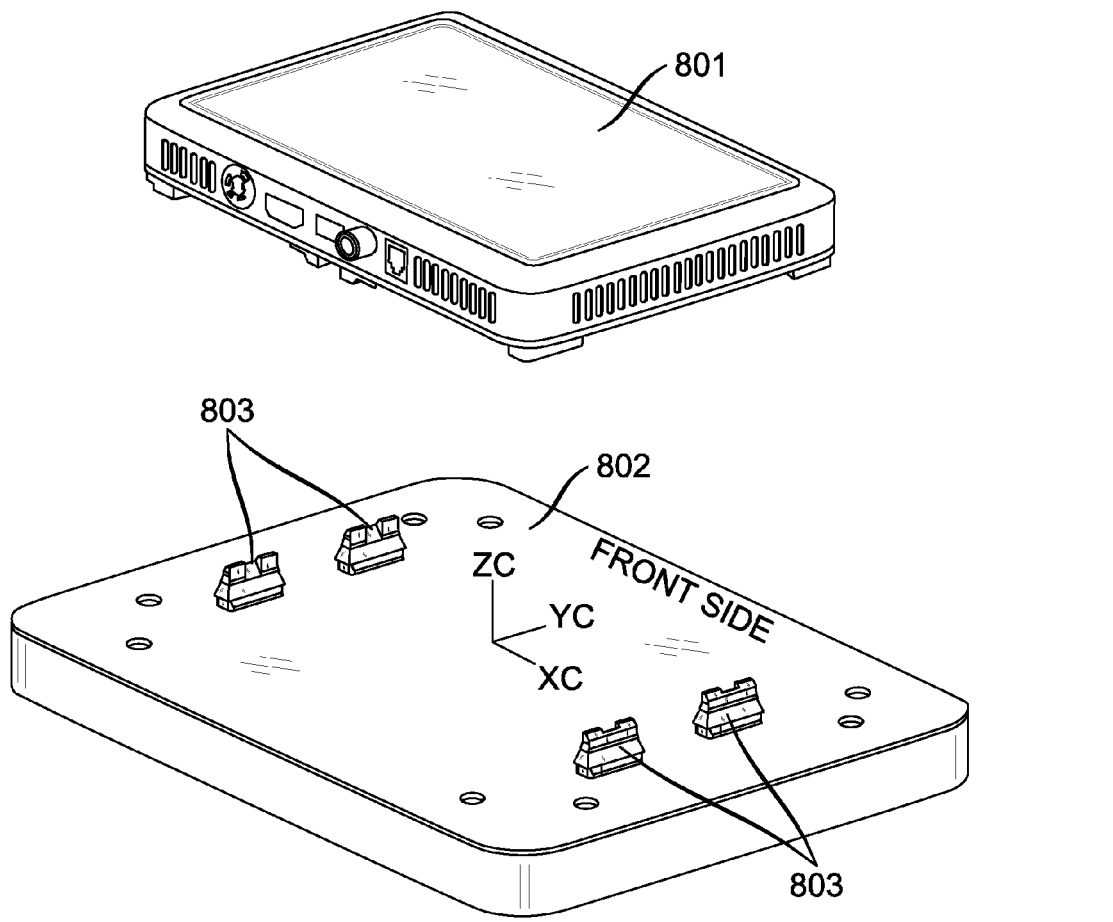
FIG. 8 is a perspective view of the assembled set top box or the like is being placed on the release fixture according to the invention.

FIG. 8 is a perspective view of the present disclosure in which the assembled set top box 801 or the like is being placed on the release fixture 802. The release fixture can include a plurality of decoupling members 803 which help to hold the base of the set top box on the fixture as the top cover of the set top box is lifted up. It should be pointed out the other types of the decoupling members 40 such as the conventional ones shown in FIG. 5 can be included on the fixture with the novel members, such that the designer can use many locks to enhance the security of the set top box. In other words, only a small number of decoupling members 803 in FIG. 8 are necessary for holding the base down and conventional members 40 can be included to unlock other coupling clips 30. Ideally, four decoupling members 803 are used.

Figure 9A:
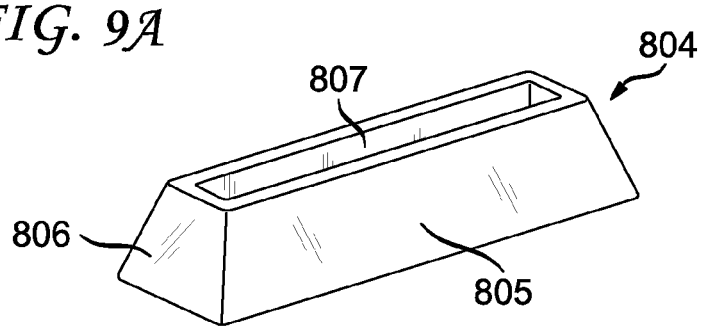
FIG. 9 shows perspective views of the decoupling member and its components on the release fixture according to the invention.
Figure 9B:
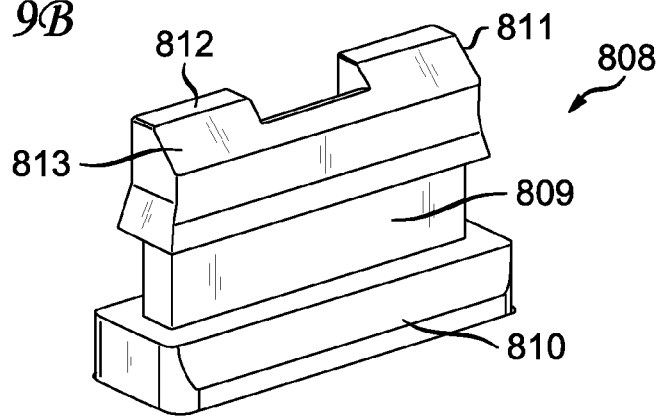
Figure 9C:
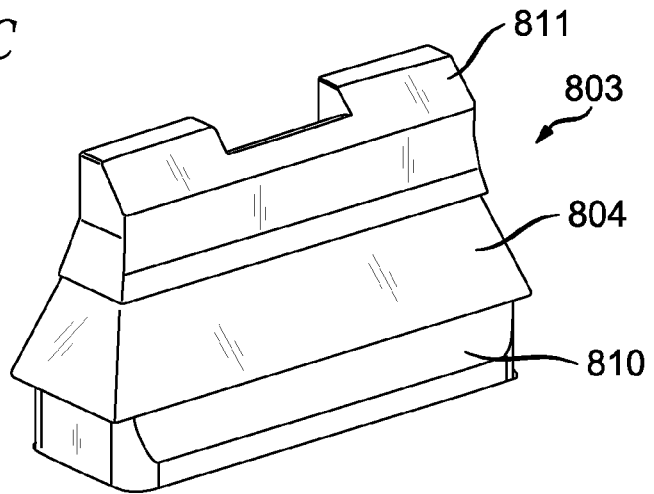

FIG. 9 shows perspective views of the decoupling member or ejector pin 803 with lock rubber 804 which are mounted on the top surface of the release fixture. FIG. 9A specifically shows the lock rubber 804, which can be oriented vertically with respect the top surface and can have a vertical through hole 807 surrounded by two opposing tapered side ends 806 and two opposing tapered deformable gripping surfaces 805. FIG. 9B specifically shows the ejector pin frame 808 that has (1) a base portion 810 that mounts onto the top surface of the release fixture, (2) an ejector pin head 811 at a distal end of the ejector frame, and (3) intermediate core portion 809 between the base portion 810 and the head 811. The ejector pin head 811 can include a top surface 812 and an angled contact surface 813 that extends from the top surface 812. The intermediate core portion 809 can be a horizontal groove surrounding the periphery of the member 803 and is intend to receive and hold the lock rubber 804 between lower shoulders of the head 811 and upper shoulders of the base portion 810 as shown in FIG. 9C.

Figure 10A:
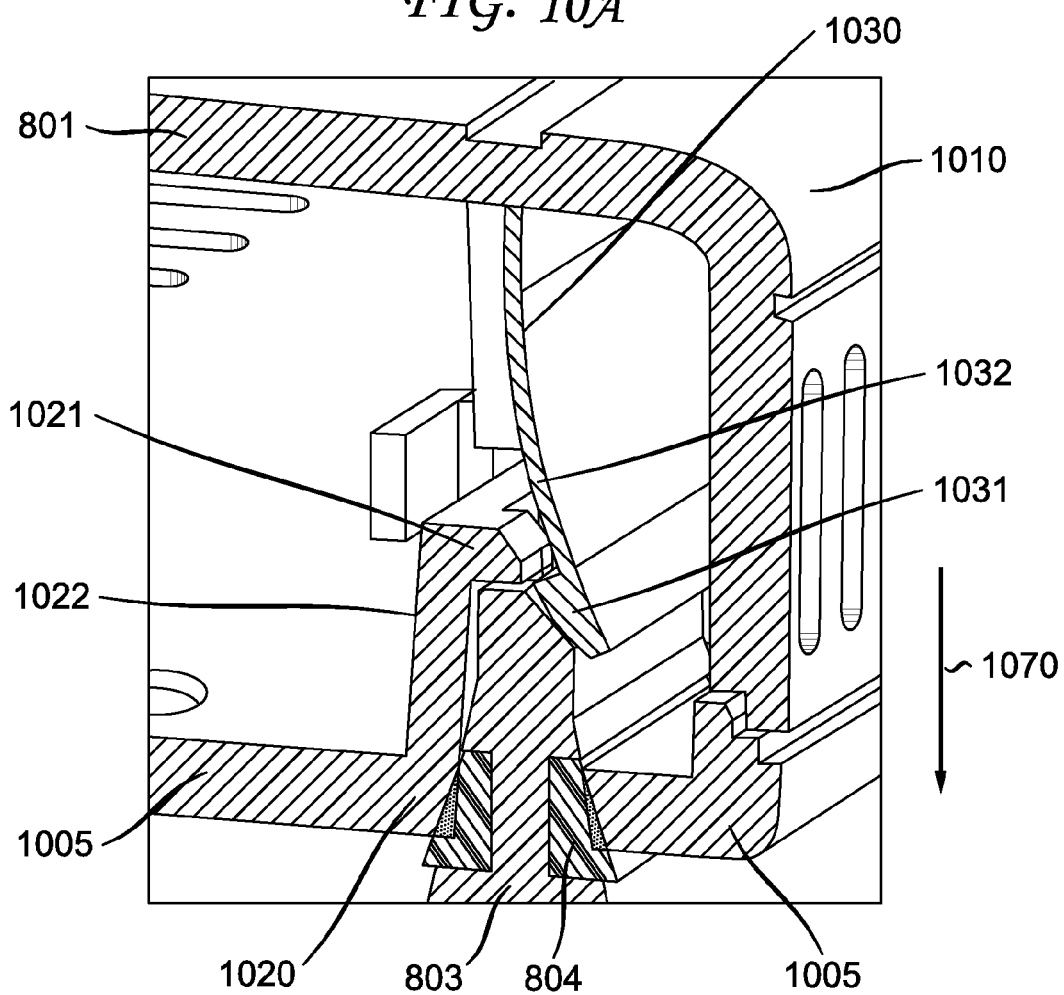
FIG. 10 shows perspective views in which the set top box or the like is fully placed on the release fixture and is in condition for disassembly according to the invention.
Figure 10B:
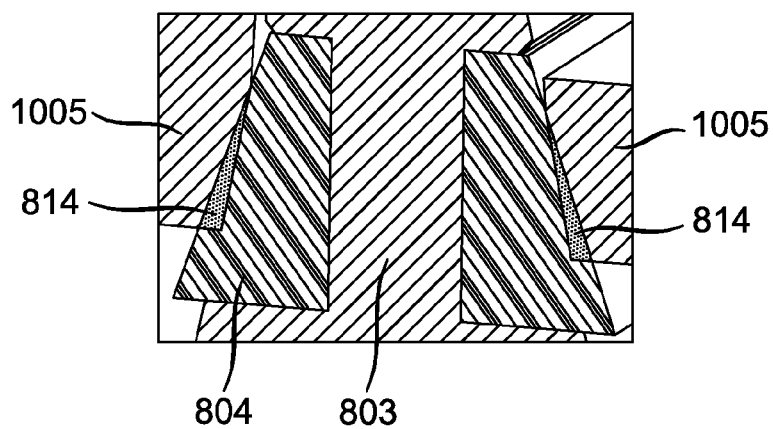

FIGS. 10A and 10B shows perspective views in which the set top box or the like is fully placed on the release fixture and is in condition for disassembly. These figures show the unlocking of one of the coupling clips 1030 from one of the clip receiving members 1020. The coupling clips 1030 can vertically extend downward from the bottom or interior surface of the top cover 1010. The clip receiving members 1020 can include an upwardly or inwardly extending part 1022 that extends from the base 1005 and can include a shoulder 1021 that faces the coupling clip 1030. The coupling clip 1030 can have a grasping portion 1031 at the distal end of its downwardly or inwardly extending portion 1032, which can be flexible. The grasping portion 1031 can have a sloped lower surface that faces the upwardly or inwardly extending part 1022 of the clip receiving member 1020 and forms an acute angle with the downwardly or inwardly extending portion 1032. The grasping portion 1031 further can include an upper ledge that protrudes from the extending portion 1032 and can form an acute angle with the sloped lower surface. It should be pointed out that the locking of the set top box is facilitated by the upper ledge of the grasping portion 1031 engaging and overlapping the shoulder 1021. The unlocking can be facilitated by a single linear motion 1070 of the set top box onto the release fixture such that the decoupling member enters an aperture in the base 1005 and the angled contact surface 813 of the decoupling member 803 contacts the sloped lower surface of the grasping portion 1031, thereby displacing the grasping portion such that the extending portion 1032 flexes away from the extending part 1022 and the upper ledge of the grasping portion 1031 and the shoulder 1021 no longer engage and no longer overlap. The angle contact surface 813 of the decoupling member 803 and the sloped lower surface of the grasping portion 1031 can have similar or the same slopes and face each upon contact. Concurrently, as the motion 1070 is completed, the angled contact surfaces 813 of the lock rubber 804 contact edges of the base 803 that surround the aperture of the base, thereby causing the surfaces to squeeze or deform at deformation or grasping regions 814 where the lock rubber 804 contact the edges. The squeezing or deformation 814 causes the lock rubber 804 and the base 1005 to couple or lock together.

Figure 11:
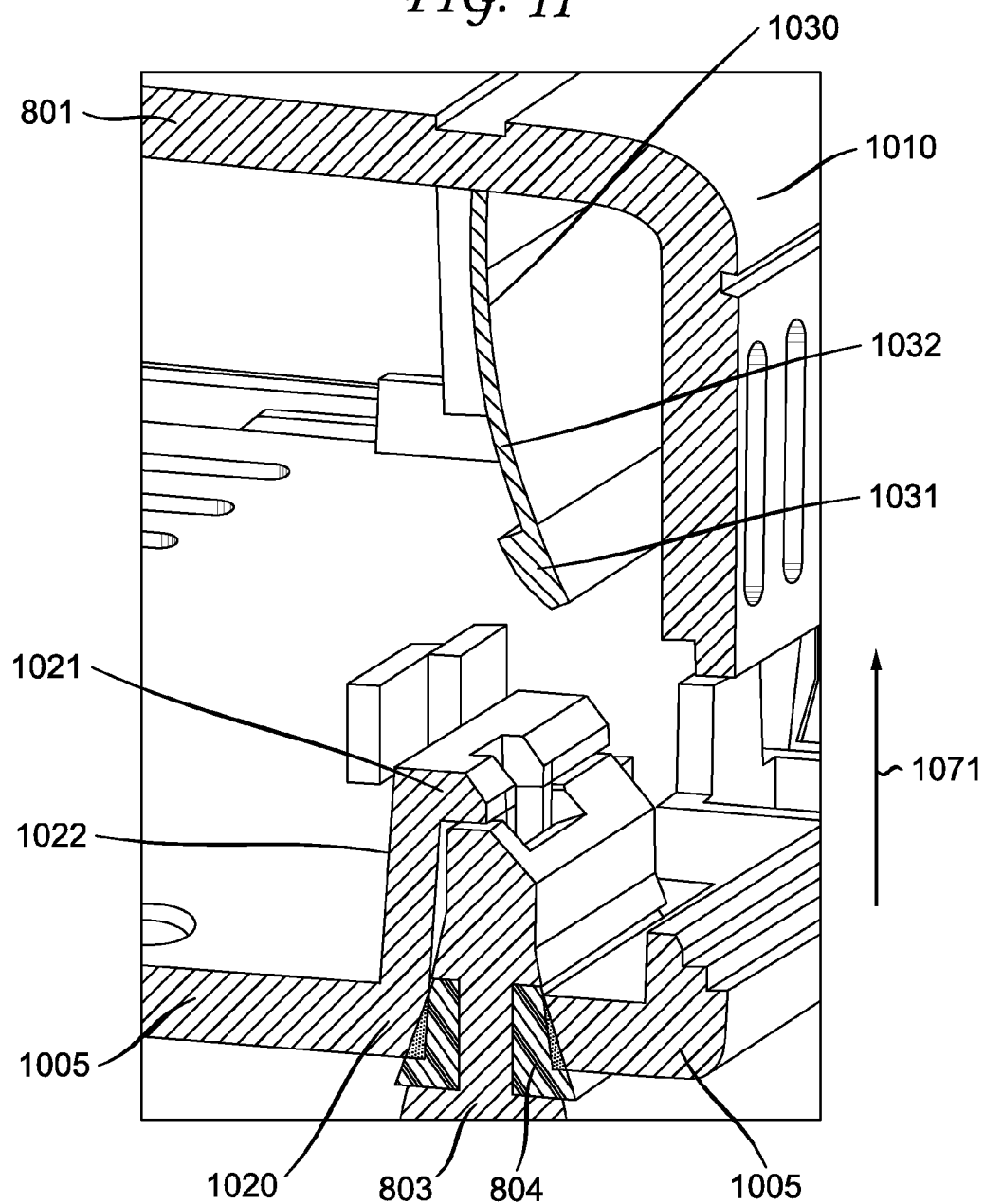
FIG. 11 is a perspective view in which the set top box or the like is disassembled with the aid of the release fixture according to the invention.

With the lock rubber 804 and the base 1005 coupled or locked together as shown in FIG. 10B, FIG. 11 shows that the top cover 1010 can be removed or displaced from the base 1005 by a single linear upward release motion 1071, wherein the base 1005 remains on the release fixtures. Although only one unlocking example is shown in FIG. 11, it should be understood that the similar action is concurrently occurring where there are other decoupling members 803.

In sum, the disclosed disassembly jigs or release fixtures can permit the cover to remain positioned on the base or frame when detached. However, the release fixture can hold the base while the cover is removed which can be advantageous because there will be some friction or squeezing of the locking rubber around the aperture in the base.

Figure 12:
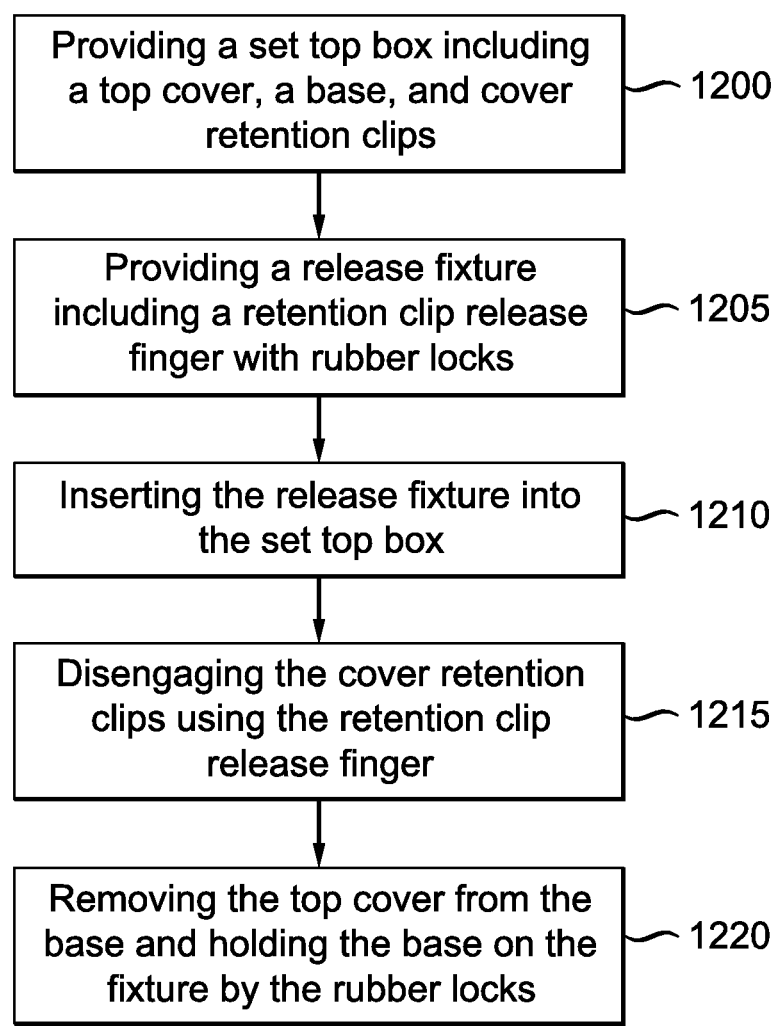
FIG. 12 is a flow diagram of an example method for disassembling a set top box using a disengagement fixture according to the invention.

FIG. 12 is a flow diagram of an example method for disassembling a set top box using a disengagement fixture. FIG. 12 is a flow diagram of an example method for disassembling a set top box using a disengagement fixture. As illustrated in FIG. 12, a method for disassembling a set top box can include providing a set top box including a top cover, a base, and cover retention clips (1200). The method can further include providing a release fixture including a retention clip release finger (1205) having lock rubbers 804. The method can further include inserting the release fixture into the set top box (1210). The method can further include disengaging the cover retention clips using the retention clip release finger (1215). The method can further include removing the top cover from the base (1220) and concurrently holding the base on the fixture by the lock rubbers. After providing the set top box (1200), the method can include securing the top cover to the base by lifting the set top cover up from the release by specifically lifting the base and not the cover, thereby removing the lock rubbers from the edges.

While embodiments of the invention have been described, it will be appreciated that modifications of these embodiments are within the true spirit and scope of the invention. For example, a feature of the invention is that the set top box with the clips does not have any screws or bolts holding the cover to the frame. In some embodiments, two or more method steps can occur in a different order or simultaneously. These and other variations of the methods disclosed herein will be readily apparent, especially in view of the description of the method described herein, and are considered to be within the full scope of the invention.

The invention claimed is:

1. An apparatus comprising:
a first wall having clips on an interior surface of the first wall;
a second wall having retainers on an inner surface of the second wall, the inner surface of the second wall facing the interior surface of the first wall, the interior and inner surfaces defining an interior space;
wherein the respective clips and retainers are engaged with one another such that all of the respective clips and retainers are adapted to simultaneously disengage by a plurality of decoupling members having lock rubbers thereon;
wherein the decoupling members have an alignment corresponding to the respective clips and retainers and adapted to be moved in unison;
wherein the lock rubbers are adapted to grasp and hold the second wall down as the first wall is lifted upward away from the second wall.

2. The apparatus of claim 1, wherein the plurality of clips and retainers define a series of locks between the first wall and second wall.

3. The apparatus of claim 1, wherein the first wall or second wall have apertures distributed therein to permit decoupling members to enter therethrough for disengagement of the plurality of clips and retainers that lock the first wall and second wall together.

4. The apparatus of claim 3, wherein the apparatus is an electronic apparatus and at least one electronic component is contained therein.

5. The apparatus of claim 4, wherein the electronic apparatus is a set-top box.

6. The apparatus of claim 1, wherein the first wall or second wall have apertures distributed therein to permit the decoupling members to enter therethrough for disengagement of a plurality of clips and retainers locking the first wall and second wall together, wherein the apertures are adapted to permit a release fixture having a plurality of decoupling members extending from a plate to simultaneously disengage the clip receiving members.

7. An apparatus comprising:
a top having an interior surface and a plurality of coupling clips extending from the interior surface; and
a base having an inner surface and a plurality of clip receiving members extending from the inner surface, the clip receiving members reversibly engaging the coupling clips to secure the top to the base, the base further including at least one aperture adapted to permit a release fixture having a plurality of decoupling members extending from a plate to simultaneously disengage the clip receiving members;
wherein the decoupling members have lock rubbers which align with the respective clip receiving members and coupling clips and the decoupling members are adapted to be moved in unison;
wherein the lock rubbers are adapted to grasp and hold the base as the top is lifted when the decoupling members are inserted the at least one aperture.

8. The apparatus of claim 7, wherein the coupling clips have grasping portions engaging receiving members.

9. The apparatus of claim 8, wherein the grasping portions are at distal ends of inwardly extending portions that extend from the top.

10. The apparatus of claim 9, wherein the apparatus further comprises:
the clip receiving members including inwardly extending parts extending from the inner surface and shoulders at distal ends of inwardly extending parts, and
portions of the coupling clips laterally and vertically overlapping the shoulders.

11. The apparatus of claim 9, wherein the clip receiving members extend from the base and have shoulders at distal ends of inwardly extending parts, and the grasping portions being snapped into the clip receiving members by having the respective shoulders of the grasping portions extending passed the shoulders of the clip receiving members and having the respective shoulders overlap and being contact with each other or in proximity to each other, thereby securing the top to the base.

12. The apparatus of claim 11, wherein at least one grasping portion have a sloped side that extends from an end of the shoulder and at least part of the sloped side forms an acute angle with the shoulder.

13. A method comprising:
providing a set top box;
providing a release fixture having decoupling members;
aligning and inserting the decoupling members to a base of the set top box having a top connected to the base, wherein grasping portions of coupling clips of the top are engaged with clip receiving members of the base to lock the top to the base;
applying a linear force to the release fixture to cause the decoupling members in apertures of the base, wherein lock rubbers on each decoupling members wedge against the apertures of the base, thereby coupling the base to the release fixture, and wherein the decoupling members simultaneously contact grasping portions and laterally reposition the grasping portions of the coupling clips to disengage the grasping portions from the clip receiving members; and
lifting off the top, whereby the base remains on the fixture.

14. A release fixture comprising:
a plate;
decoupling members on the plate;
each of the decoupling members comprises:
a base portion on the plate;
an ejector pin head at a distal end and an intermediate core portion between the base portion and the ejector pin head; and
a lock rubber surrounding the intermediate core portion.

15. The release fixture of claim 14 wherein the lock rubber is oriented vertically with respect to the plate and has a vertical through hole that contains the intermediate core portion; and the lock rubber has two opposing tapered deformable gripping surfaces.

* * * * *